United States Patent
Chrysostomides et al.

(10) Patent No.: US 6,236,612 B1
(45) Date of Patent: May 22, 2001

(54) INTEGRATED SEMICONDUCTOR MEMORY CONFIGURATION WITH SELF-BUFFERING OF SUPPLY VOLTAGES

(75) Inventors: Athanasia Chrysostomides, München; Robert Feurle, Neubiberg; Robert Kaiser, Kaufering; Helmut Schneider, München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/523,146

(22) Filed: Feb. 22, 2000

(30) Foreign Application Priority Data

Feb. 19, 1999 (DE) .............................. 199 07 155

(51) Int. Cl.$^7$ ..................................... G11C 7/00
(52) U.S. Cl. ................. 365/226; 365/51; 365/63
(58) Field of Search ................ 365/226, 51, 63, 365/230.03

(56) References Cited

U.S. PATENT DOCUMENTS

| 4,901,284 | * | 2/1990 | Ochii et al. | 365/226 |
| 5,293,559 | * | 3/1994 | Kim et al. | 365/63 |
| 5,321,646 | * | 6/1994 | Tomishima et al. | 365/51 |
| 5,867,440 | * | 2/1999 | Hidaka | 365/226 |

* cited by examiner

Primary Examiner—Son Mai
(74) Attorney, Agent, or Firm—Herbert L. Lerner; Laurence A. Greenberg; Werner H. Stemer

(57) ABSTRACT

The integrated semiconductor memory configuration has a plurality of memory cell fields connected to one another by low-resistance supply lines forming a power network. The power network is connected to a voltage generator via a high-resistance supply line. An activated memory cell field is supplied, for the purpose of such activation, by self-buffering from the other memory cell fields (1–5, 7–8).

6 Claims, 1 Drawing Sheet

INTEGRATED SEMICONDUCTOR MEMORY CONFIGURATION WITH SELF-BUFFERING OF SUPPLY VOLTAGES

BACKGROUND OF THE INVENTION

FIELD OF THE INVENTION

The invention lies in the field of semiconductor technology. More specifically, the present invention relates to an integrated semiconductor memory configuration with a plurality of memory cell fields. A respective one of the memory cell fields can be activated at a given time as defined. The configuration further includes a voltage generator for delivering a supply potential to the memory cell fields, first electrical supply lines between the voltage generator and the plurality of memory cell fields, and second electrical supply lines between the plurality of memory cell fields.

To date, individual memory cell fields in integrated semiconductor memory configurations have each been connected with low resistance to a voltage generator via electrical supply lines in order to provide the individual memory cell fields with the supply voltage that is necessary in each case. Now, the individual memory cell fields in an integrated semiconductor memory configuration are activated successively as defined, so that, at a given instant, an accurately defined power quantity must be provided for a memory cell field which is currently activated.

The currently activated memory cell field thus forms an active region, while all the other memory cell fields represent inactive regions at the time that the activated memory cell field is activated.

Experiments have shown that it is sufficient to transfer a capacitance of approximately 70 pF in order to activate a memory cell field. A typical semiconductor memory configuration with a multiplicity of memory cell fields has a capacitance of approximately 2 nF available.

SUMMARY OF THE INVENTION

The object of the invention is to provide an integrated semiconductor memory configuration which overcomes the above-noted deficiencies and disadvantages of the prior art devices and methods of this kind, and which, while being of simple design, is immediately able to provide the power required to activate a memory cell field using short supply lines.

With the above and other objects in view there is provided, in accordance with the invention, an integrated semiconductor memory configuration, comprising:

a plurality of memory cell fields each being respectively activatable at a given time;

a voltage generator for delivering a supply potential to the memory cell fields;

first electrical supply lines connected between the voltage generator and the plurality of memory cell fields; and second electrical supply lines connected between the plurality of memory cell fields;

the first electrical supply lines having a relatively high resistance and the second supply lines having a relatively low resistance.

In other words, the objects of the invention are satisfied in the integrated semiconductor memory configuration of the type mentioned in the introduction wherein the first supply lines are designed to have a high resistance and the second supply lines are designed to have a low resistance.

In doing so, the invention takes a path which is completely different from that of the prior art: instead of designing the supply lines between the voltage generator and the individual memory cell fields to have a low resistance in order to ensure that the power required in each case is thus provided quickly, the connection between the voltage generator and the individual memory cell fields is designed to have a high resistance in the integrated semiconductor memory configuration according to the invention. Accordingly, the supply lines between the individual memory cell fields have a low resistance. In this manner, the total capacitance of all the memory cell fields which are currently not activated is advantageously utilized so that a particular memory cell field can be activated at a given instant.

This means that the wiring complexity can be minimized without impairing the electrical parameters as a result of dips in the supply voltage. "Self-buffering" of a selected memory cell field from all the other memory cell fields, which are not activated at this instant, is particularly advantageous because precisely predictable, defined activation is achieved in each case. The power required to activate a particular memory cell field is defined and is the same for the individual memory cell fields. This power is derived from the capacitors on the memory cell fields which are currently not activated. The memory cell fields as a whole are connected via a high-resistance supply line to the voltage generator, which thus continuously "refreshes" the power stored in the capacitors in the individual memory cell fields.

In accordance with an added feature of the invention, the memory cell fields are disposed in a row, and the second supply lines are routed along the two sides of the row of memory cell fields.

In accordance with another feature of the invention, the second supply lines surround the memory cell fields.

In other words, the low-resistance supply lines are routed along both sides of the row of memory cell fields, whereas the latter have previously been wired together only on one side using a high-resistance connection line. In addition, these low-resistance supply lines are also arranged around the individual memory cell fields, so that each individual memory cell field is "framed" by the low-resistance supply lines.

In accordance with an additional feature of the invention, an additional second supply line (also a low-resistance supply line) is routed in the center of the memory cell fields.

In accordance with a further feature of the invention, the second supply lines are formed with a track width of between approximately 3 and 4 $\mu$m.

In accordance with a concomitant feature of the invention, the first and second supply lines are made of aluminum and/or copper.

Hence, the essential feature of the present invention is the connection of the individual memory cell fields to one another by means of low-resistance supply lines and the connection of these memory cell fields to a voltage generator using a high-resistance supply line. In addition, the low-resistance supply lines are designed to go around the individual memory cell fields, thus ensuring that the latter are supplied at low resistance. If a particular memory cell field is activated, the power required for this is derived from the other memory cell fields, which are inactive at this instant. The power consumed is continuously refreshed via the high-resistance supply line between the memory cell fields and the voltage generator.

Thus, the integrated semiconductor memory configuration according to the invention uses a multiplicity of memory cell fields, representing extensive circuit regions, to buffer the supply potentials of the few, simultaneously activated regions in the form of a respectively driven memory cell field. In this case, these circuit regions are connected by the low-resistance supply lines, which represent a "power network", this network being coupled to a voltage generator using a high-resistance supply line.

Other features which are considered as characteristic for the invention are set forth in the appended claims.

Although the invention is illustrated and described herein as embodied in an integrated semiconductor memory configuration with self-buffering of supply voltages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE is a schematic block diagram of an integrated semiconductor memory configuration.

DESCRIPTION OF THE PREFERRED EMBODIMENT

Figure 1:
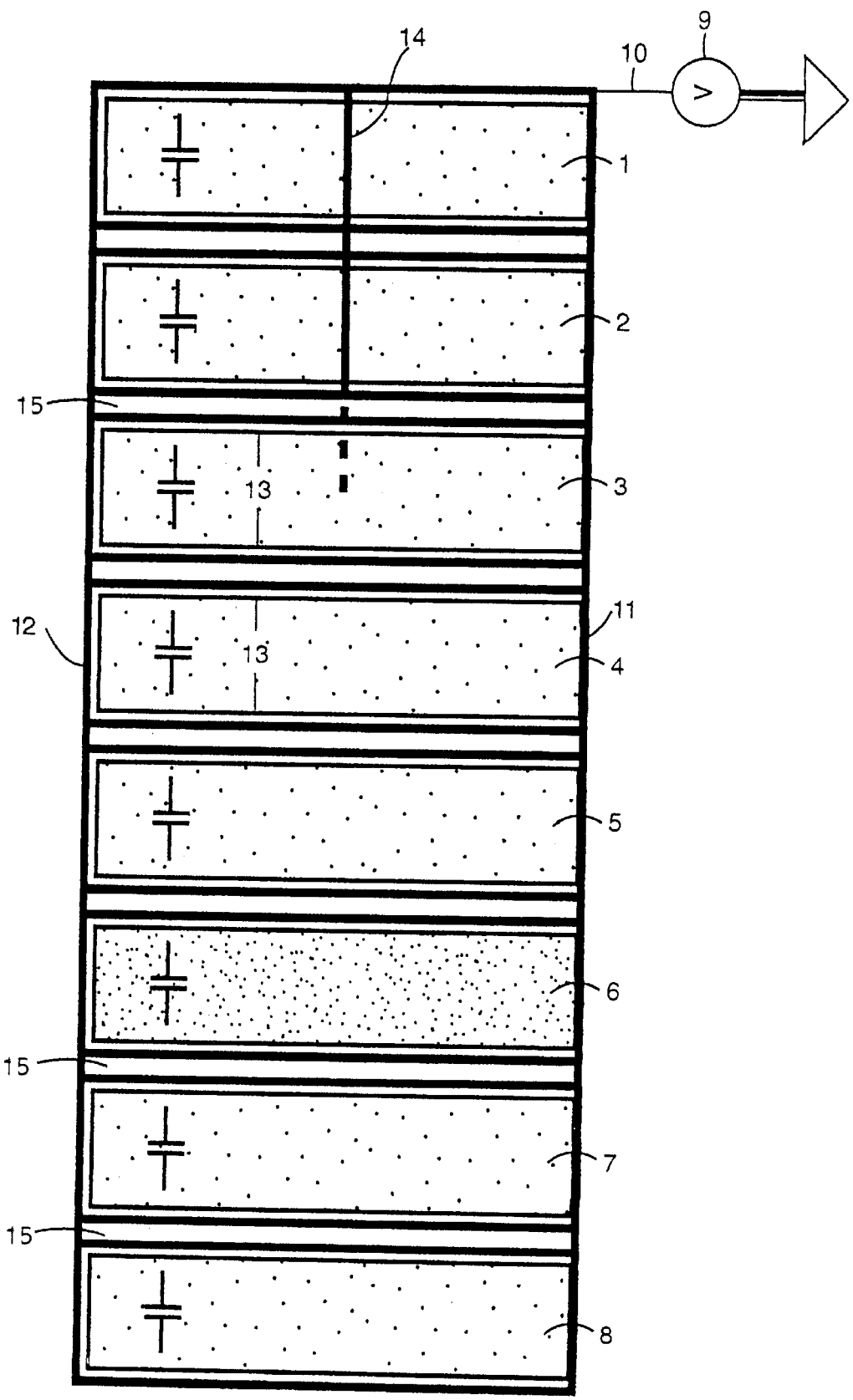

Referring now to the sole FIGURE of the drawing in detail, the integrated semiconductor memory configuration according to the invention comprises memory cell fields 1 through 8 which are arranged in a row and are connected to one another on both sides by means of low-resistance supply lines 11 and 12. The lines 11, 12 have a conductor track width of between 3 and 4 µm. In addition, low-resistance supply lines 13 are also routed around the individual memory cell fields 1 to 8. In addition, one (or more) further low-resistance supply line 14 can also run through the center of the memory cell fields.

Sense amplifiers 15 are arranged in each of the regions between the memory cell fields 1 to 8.

The low-resistance supply lines 11, 12, 13 and possibly 14 form a low-resistance "power network" which is connected to a voltage generator 9 by means of a high-resistance line 10.

The low-resistance supply lines 11 to 13, and possibly 14, are made of aluminum and/or copper and, as already mentioned, have a conductor track width of approximately 3 to 4 µm.

In such an integrated semiconductor memory configuration, only one memory cell field is activated in each case. Assume, for example, that the memory cell field 6 is activated. The power or energy required for such activation is obtained through self-buffering from the capacitors on the other memory cell fields 1 to 5, 7 and 8. These capacitors have a capacitance value of approximately 2 nF, which is entirely sufficient to transfer the 70 pF required to activate the memory cell field 6.

Of course, different numbers of memory cell fields can also be connected to one another in the integrated semiconductor memory configuration according to the invention. It will also be readily understood that these memory cell fields do not need to be in a row as shown in the illustrative embodiment. It is much more important for the individual memory cell fields to be connected to one another with low resistance, and also for only one memory cell field or a plurality of memory cell fields (as long as they are fewer than the total number of memory cell fields) to be activated in each case, with the same activation energy being required for a memory cell field in each case. This energy or power is derived through self-buffering from the memory cell fields which are currently not activated, and the low-resistance connection means that it is immediately supplied to the memory cell field which is to be activated. The high-resistance line 10 that connects to the voltage generator 9 is used to supply power continuously to the power network comprising the low-resistance supply lines 11 to 13 and possibly 14 in order to charge the respective capacitors on the memory cell fields.

We claim:

1. An integrated semiconductor memory configuration, comprising:

a plurality of memory cell fields each being respectively activatable at a given time;

a voltage generator for delivering a supply potential to said memory cell fields;

first electrical supply lines connected between said voltage generator and said plurality of memory cell fields; and second electrical supply lines connected between said plurality of memory cell fields;

said first electrical supply lines having a relatively high resistance and said second supply lines having a relatively low resistance.

2. The integrated semiconductor memory configuration according to claim 1, wherein said memory cell fields are disposed in a row with two sides, and said second supply lines are routed along said two sides of said memory cell fields.

3. The integrated semiconductor memory configuration according to claim 2, which comprises an additional second supply line routed in a center of said memory cell fields.

4. The integrated semiconductor memory configuration according to claim 1, wherein said second supply lines surround said memory cell fields.

5. The integrated semiconductor memory configuration according to claim 1, wherein said second supply lines are formed with a track width of between approximately 3 and 4 µm.

6. The integrated semiconductor memory configuration according to claim 1, wherein said first and second supply lines are made of a metal selected from the group consisting of aluminum and copper.

* * * * *